United States Patent [19]

Huignard

[11] Patent Number: 4,591,241
[45] Date of Patent: May 27, 1986

[54] ACOUSTO-OPTICAL SPECTRUM ANALYZER

[75] Inventor: Jean-Pierre Huignard, Paris, France

[73] Assignee: Thomson-CSF, Paris, France

[21] Appl. No.: 549,443

[22] Filed: Nov. 7, 1983

[30] Foreign Application Priority Data

Nov. 16, 1982 [FR] France .............................. 82 19141

[51] Int. Cl.$^4$ .......................... G02F 1/33; G01R 23/16
[52] U.S. Cl. ................................ 350/358; 310/313 R; 324/77 C
[58] Field of Search ...................... 350/358, 371–373, 350/162.21; 310/313 R, 313 A–313 D; 367/7; 324/77 C; 333/154; 364/821

[56] References Cited

U.S. PATENT DOCUMENTS 3,633,995  1/1972  Lean et al. ........................ 350/358
3,919,669  11/1975  Hartemann ...................... 310/313 B

FOREIGN PATENT DOCUMENTS 101913  8/1980  Japan ................................ 350/358
111513  7/1982  Japan ................................ 350/358

OTHER PUBLICATIONS

Fujii et al., "Cylindrical Concave Diffraction Grating Utilizing Thin Silicon Chip", Electronics Letts. 11-26-81, pp. 934–936.
Chen et al., "New Grating Acoustic Scanner", 1978 Ultrasonics Symp. Proc., IEEE Cat. #78CH1344-1SU, Sep. 25-27, 1978, pp. 775-779.

*Primary Examiner*—William H. Punter
*Attorney, Agent, or Firm*—Cushman, Darby & Cushman

[57] ABSTRACT

The invention relates to an acousto-optical device comprising a laser source, positioned in the vicinity of the center of curvature of a spherical cap, formed from an elasto-optical, piezoelectric substrate. A piezoelectric transducer deposited on this substrate makes it possible to generate a surface sound wave, which propagates on the outer surface of the spherical cap. The signal diffracted by the substrate is collected on a line of detectors, placed in a plane close to the center of curvature of the cap.

4 Claims, 5 Drawing Figures

ACOUSTO-OPTICAL SPECTRUM ANALYZER

BACKGROUND OF THE INVENTION

The present invention relates to an acousto-optical spectrum analyzer.

In a prior art acousto-optical spectrum analyzer a sound wave is propagated in an interaction medium and creates in volume an index network moving at the velocity of sound $V_S$ in the material. The thus generated network diffracts an incident optical wave under Bragg conditions.

A line of detectors placed in this focal plane of a lens located at the outlet from said medium makes it possible to spectrally analyze the signal transmitted on the piezoelectric transducer which generates the sound wave in the interactive medium. However, the optical components used must be limited by diffraction in order to obtain a good resolution. This leads to the construction of spherical and cylindrical lenses with a small numerical aperture, which makes the device particularly large and difficult to regulate. In order to obviate this disadvantage, identical configurations have been proposed in integrated optics technology.

In this case, the difficulty occurs in the manufacture of wave guides with small losses and high performance geodesic lenses. Moreover, the laser-guide coupling and the guide-detector coupling constitute difficult operations leading to significant losses.

SUMMARY OF THE INVENTION

The analyzer according to the invention ensures a spectral analysis of the signal with a high resolution. It has reduced dimensions and operates with a simple optical structure at the limits of the diffraction. Moreover, this spectrum analyzer is based on acouosto-optical interaction. It is characterized by the simplicity of the optical structure adopted and is compatible with a high resolution. Examples of possible applications are in the field of avionics (e.g. recognition of signatures) and signal processing.

The present invention therefore specifically relates to a spectrum analyzer comprising a light source supplying a collimated light beam, a piezoelectric, elasto-optical interaction medium, a transducer which generates an acousto-optical wave in this medium, said acousto-optical wave creating an index grating with a specific spraying propagating at the velocity of sound $V_S$ in the said medium, said transducer being subject to the action of a control signal, and a line of detectors for detecting the spectrum of the control signal, the light beam being diffracted by this index grating network in order to reach the line of detectors, wherein the source is positioned in the vicinity of the centre of curvature of the interaction medium, which is in the form of a spherical cap or cup, the transducer being in the form of a split-finger transducer deposited on the opposite face of the spherical cap or cup with respect to the source, the acousto-optical wave generator being a surface wave.

BRIEF DESCRIPTION OF THE DRAWINGS

The invention is described in greater detail hereinafter relative to non-limitative embodiments and with reference to the attached drawings, wherein show.

DETAILED DESCRIPTION OF THE INVENTION

Figure 1:
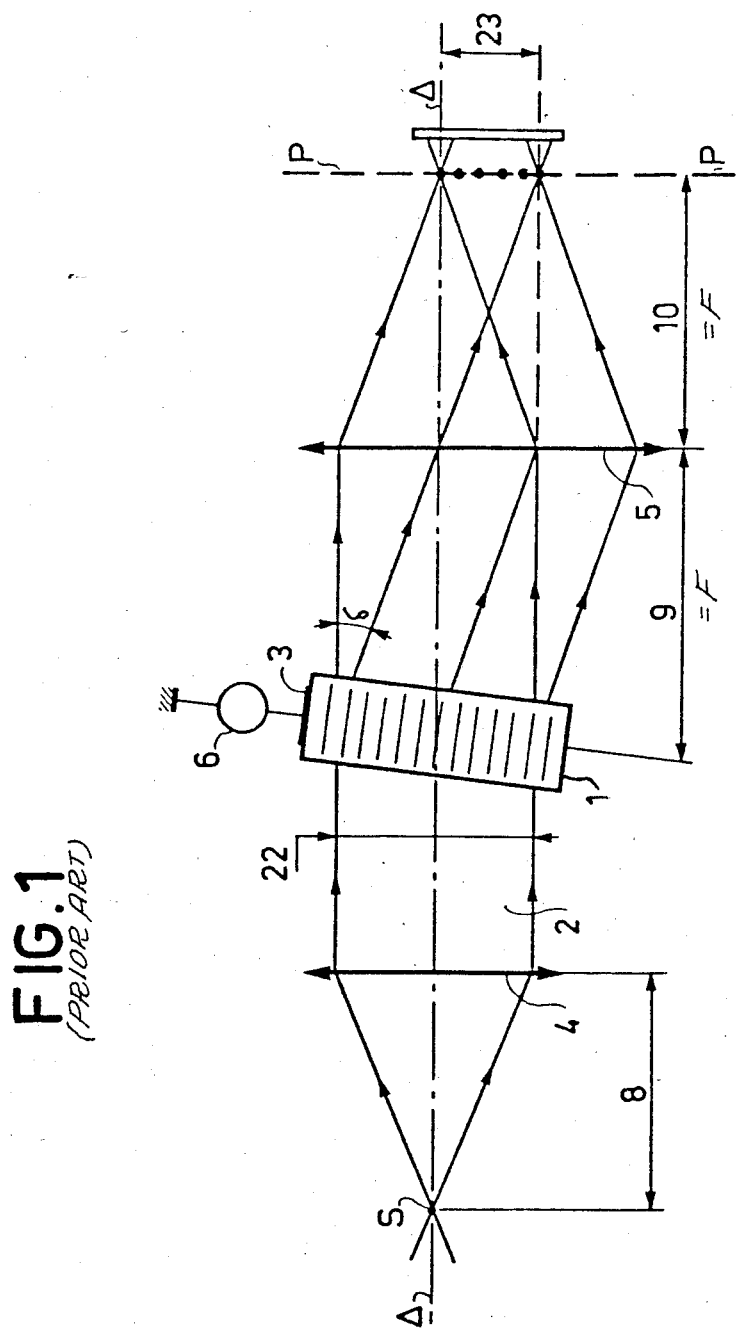
FIG. 1 a prior art analyzer.

The diagram of a prior art acousto-optical spectrum analyzer is given in FIG. 1. The sound wave propagating in the interaction medium 1 creates in volume an index network moving at the velocity of sound $V_S$ in the material.

Under Bragg conditions, the thus generated network diffracts an incident optical plane wave 2, which explains the slope of the medium relative to the axis $\Delta$ of the mean propagation direction represented in FIG. 1. The distances 8, 9 and 10 are equal to the respective focal distances of the lenses 4 and 5, so that it is possible to have a plane wave which reaches medium 1, as well as a convergent beam in the plane of the detectors, whose mean axis is always parallel to axis $\Delta$. The angle $\delta$ between the two beams from the medium 1 is:

$$\delta = (\lambda/V_S) \times f_1$$

$\lambda$ being the wavelength of the incident beam and $f_1$ the frequency of the control signal on piezoelectric transducer 3. Thus, for each frequency $f_i$, there is in the focal plane P of lens 5 or the Fourier plane, a focusing point, whose position 23 relative to the axis $\Delta$ is given by the relation:

$$X_i = \tfrac{1}{2}(\lambda/V_S) \times f_i \times F$$

with $F = 9 = 10$ (focal distance)

A line of detectors 7 placed in this plane P makes it possible to spectrally analyze signal 6 transmitted on piezoelectric transducer 3. This signal 6 is a high frequency signal f, e.g. between 100 and 500 MHz. Thus, $f_o$ is the centre frequency of the control signal and $\Delta F$ the frequency band to be analyzed, so that the number of points resolved in the Fourier plane is:

$$N = \Delta F \times (D/V_S)$$

D is the height 22 of the elasto-optical material illuminated by the incident radiation, taking account of the figures of merit of the conventionally used materials lead molybdate ($PbMoO_4$), tellurium oxide ($TeO_2$), lithium niobate ($Li\ Nb\ O_3$), etc resolutions exceeding 1000 points are obtained.

It should also be noted that these resolutions are only effectively measured if all the optical components are limited by diffraction. This condition leads to the obtaining of spherical and cylindrical lenses with a small numerical aperture, which makes the device particularly large and difficult to regulate. In order to obviate this disadvantage, configurations identical to those of FIG. 1 have been proposed in integrated optics technology on e.g. a lithium niobate substrate.

In this case, the difficulty occurs in the manufacture of wave guides with small losses and high performance geodesic lenses (numerical aperture, residual aberrations, etc), in order to obtain the perfect wave fronts necessary for obtaining a good resolution of the device. Moreover, the laser-guide and guide-detector coupling constitutes a difficult operation, which leads to significant losses in connection with the transmitted light signal.

However, the analyzer according to the invention ensures a spectral analysis of the signal with high resolution. It has reduced overall dimensions and functions with a simple optical structure at the diffraction limits.

Figure 2:
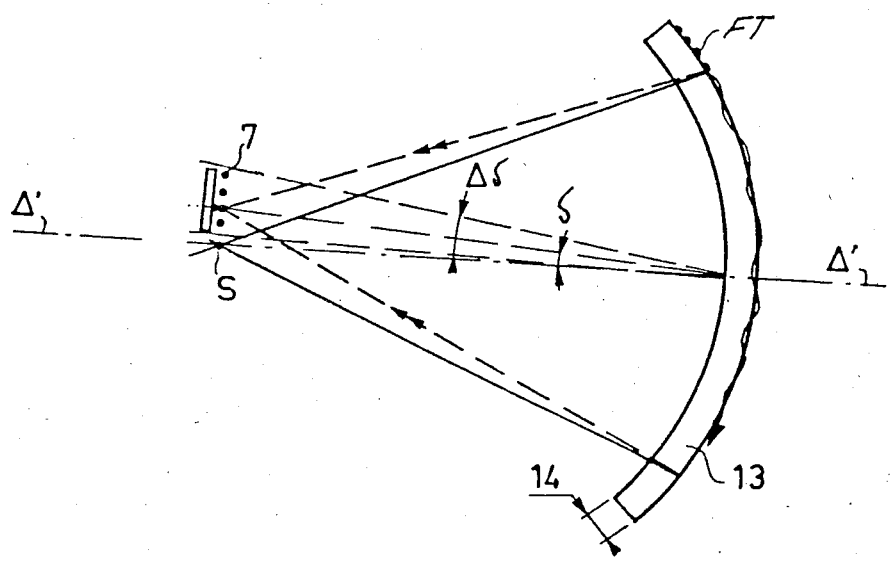
FIG. 2 the analyzer according to the invention.

A diagrammatic representation of the invention is provided in FIG. 2 and respectively comprises:

A point sources, e.g. from a helium-neon (HeNe) or a gallium arsenide (GaAs) laser, placed in the vicinity of the centre of curvature of a spherical "mirror" 13, produced on an elasto-optical, piezoelectric substrate e.g. of the lithium niobate type. The vicinity of the centre of curvature relates to the area of the space in which the stigmatism properties of the light beam are retained. This area is approximately one angular degree with respect to the spherical mirror. Source S may also be placed in said centre of curvature. Reference is made to a "mirror", because in the analyzer according to the invention the medium is a spherical cap or cup, which has the properties of a spherical mirror. This spherical cap can, for example, have a height between 5 and 10 centimeters.

A line of detectors 7 placed in the plane of the spectrum of the signal to be analyzed, i.e. close to the centre of curvature of the "mirror". The number of detectors used is dependent on the desired resolution in the analysis of the spectrum. These detectors can, for example, be placed on a straight line perpendicular to the axis of the mirror $\Delta'$ and aligned with source S. The surface sound waves are generated with the aid of a split-finger transducer FT shown in FIG. 3, which is deposited on the piezoelectric substrate by conventional photogravure methods. On considering a vertical section of the analyzer as shown in FIG. 2, the split-finger transducer FT must have its fingers perpendicular to this plane, in such a way that the surface wave 12 travels in a direction visible on said vertical section. The distance 16 between the median lines of two fingers of the same polarity is equal to the spacing of the layer lines $\Lambda o$ linked with the mean frequency $f_o$ of the control signal, so that we obtain: $\Lambda o = V_S/f_o$. The passage of the surface sound wave 12 shown in FIG. 4 is accompanied by two different effects. The free surface of the piezoelectric material, along which said Rayleigh wave propagates, has periodic undulation, thus creating a system of index variation fringes. There is a volume limited by the free surface and whose depth 19 is of the same order of magnitude as the wavelength of the surface vibrations. In this volume, the deformations induce variations of the refractive index by a photolastic effect, creating a system of layer lines (or index grating) of different indices 20, 29. Thus, there is both a spatial modulation of the medium, which is an elasto-optical medium through a deformation of the crystal mesh and an index variation in said medium. Thus, the thickness 14 of the medium must exceed the wavelength of the surface vibrations, i.e. values of a few micrometers, and said thickness be e.g. approximately 1 mm.

The Rayleigh waves are in fact complex waves propagating on the surface of any medium. In the simplest cases, they consist of a longitudinal displacement and a transverse displacement, phase-displaced by $\pi/2$, which definitively cancel out at a depth of approximately two wavelengths. However, this complexity is compensated by an important advantage. Rayleigh waves can be excited and detected on piezoelectric substrates by split-finger transducers having a simple technology and able to fulfil functions other than electromechanical conversion.

Figure 3:
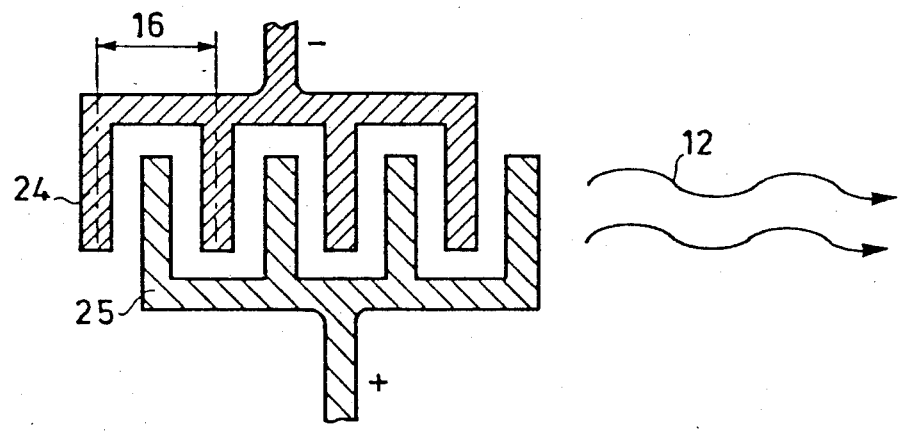
FIGS. 3 and 4 two special aspects of the analyzer according to the invention.
Figure 4:
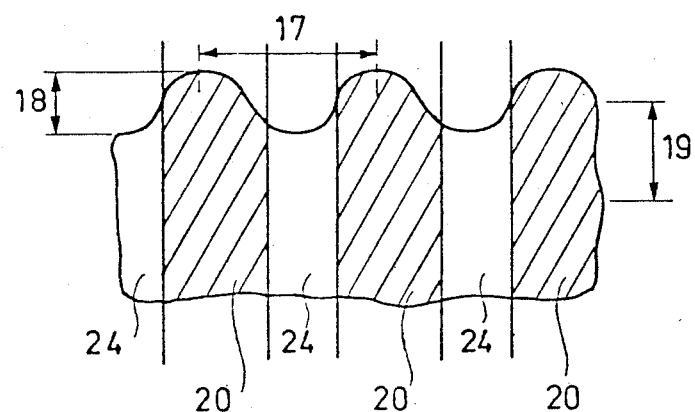

As can be gathered from FIG. 3, such a transducer comprises two comb-like metal electrodes, 24, 25 deposited on a piezoelectric substrate. The voltage applied between the two electrodes 24, 25 produces an electric field, which leads to compressions and expansions in the vicinity of the surface, giving rise to different types of elastic waves. In connection with the Rayleigh waves emitted perpendicular to the fingers of the transducers, the transducer behaves in the manner of a sequence of ultrasonic sources. When the voltage applied is sinusoidal, the vibrations are added to one another only if the distance 16 separating two adjacent fingers is equal to an elastic half-wavelength. Thus, any constraint produced at time t by a pair of fingers, for a given polarity of the voltage applied, traverses during the half-cycle T/2, the distance $\lambda/2$ at the velocity $V_R$ of the Rayleigh waves. At time $t+T/2$, said constraint has passed between the adjacent pair of fingers at the time when the voltage, which has changed sign, produces a constraint of the same phase. The elastic excitation due to the second pair of fingers is added to that emitted by the first pair. The frequency $f_o = V_R/2d$ corresponding to this cumulative effect is called the synchronous frequency or resonant frequency f. If the frequency varies from this value, the interference between the elastic signals emitted by the different pairs of fingers is not completely constructive and the resulting signal is less. Thus, the pass band of a transducer becomes smaller as it has more fingers.

The transfer function of a transducer with N fingers can be deduced from its pulse response. A short pulse compared with the transit time of the elastic waves between two fingers applied to the electrodes simultaneously excited the $N-1$ ultrasonic sources. As the electrical field is reversed at each gap between the fingers, the emitted elastic signal is periodic. The spatial period is equal to double the distance d between the axes of two adjacent fingers. The duration $\theta$ of the signal is equal to the active length of the transducer $L = (N-1)d$ divided by the velocity of the Rayleigh waves:

$$\theta = \frac{(N-1)d}{V_R} = \frac{(N-1)}{2f_o}$$

By intuitively likening this pulse response to a sinusoid of frequency $f_o = V_R/2d$ and of duration $\theta$, the frequency response equal to the Fourier transform of the pulse response appears as a curve in sin x/x, with $$x = \pi \theta (f - f_o) = (N-1) \frac{\pi (f - f_o)}{2 f_o}$$

Thus, the pass band at three decibels ($x = \pm 0.885\pi/2$) is inversely proportional to the number of gaps:

$$\Delta f/f_o \approx 1.77/(N-1)$$

Thus, to record the pulse response of a transducer, it is necessary to transform the elastic wave train emitted into an electrical signal with the aid of a receiver transducer, e.g. having interdigitated electrodes. The electrical field accompanying the elastic wave induces, when the latter passes beneath the electrodes, a potential difference which varies in time. The shape of this signal is dependent on the number of fingers of the receiver.

The diffraction of an angle δ (see FIG. 2) of the incident spherical wave by the "thin" index and thickness network, whose respective depths are depths 18 or d and 19 or Λ (see FIG. 4) is explained by the relation:

$$I_d/I_o \approx R \sin^2 100/2$$

in which
 φ=phase displacement provided after reflection
 R=reflection coefficient due to the substrate-air interface
 Id=diffracted light intensity
 Io=incident light intensity The depth d (18), consequently corresponds to the spatial modulation and the depth Λ(19) to the index variation, which is such that in zones 24 there is an index equal to n and in zones 20: n+Δn. The following numerical values can be considered as an example:

$$\phi = 2 \times \frac{2\pi}{\lambda} [\Lambda_o \Delta n + (n - 1)d]$$

$$\frac{I_d}{I_o} \approx \left(\frac{n-1}{n+1}\right)^2 \times \frac{4\pi^2}{\lambda^2} \times [\Lambda_o \Delta n + (n-1)d]^2$$

in which
 Λ0=spacing of the layer lines at frequency $f_o$.
 Δn=index variation in the medium.
 n=index value of the medium.
 λ=incident wavelength.

Thus, consideration can be given for example to:
 a lithium niobate piezoelectric substrate,
 a central frequency $f_o \approx$ 150MHz,
 a propagation velocity $V_S$=7400 ms$^{-1}$,
 an index n=2.3.
 λ=0.6 μm (He-Ne laser)
 $\Lambda_o = V_S/f_o \approx$ 50 μm.

The index and thickness variations which can be induced on the substrate are a direct function of the electric power of the control signal. For a power of a few 100mW, we obtain the following values for lithium niobate:
 d≈10Å (d can reach 20 Å)
 ΔnΔ10$^{-4}$ $$\frac{I_d}{I_o} = 16 \times 10^{-2} \times \frac{40}{0.36} [50 \cdot 10^{-4} + 1.3 \times 10 \times 10^{-4}]^2$$

Id/Io ≈ 10$^{-3}$
Resolution of the analyzer:
$N = \Delta F \times \phi/V_S$

φdiameter of the "mirror"
 frequency band ΔF=150 MHz
 dimension of the material φ=6 cm $$N = 150 \times 10^{+6} \times \frac{6 \times 10^{-2}}{7400}$$

N=1200
frequency resolution
δf=125 kHz
access time
τ=8 μs
Laser source:
Continuous helium-neon laser or semiconductor: power 10mW.
Power available per point: p=Pi/N=10nW Detection:
 strip of 10$^3$ linear detectors
 spacing of 10 μm
Exemplified embodiment:
 lithium niobate spherical cap diameter
 φ=6 cm.
 Radius of curvature
 R=15 cm.
 Mean source-detector distance $$l = R \times (\lambda/\Lambda)$$

l=1.5 cm
Thickness e=5 mm.

Figure 5:
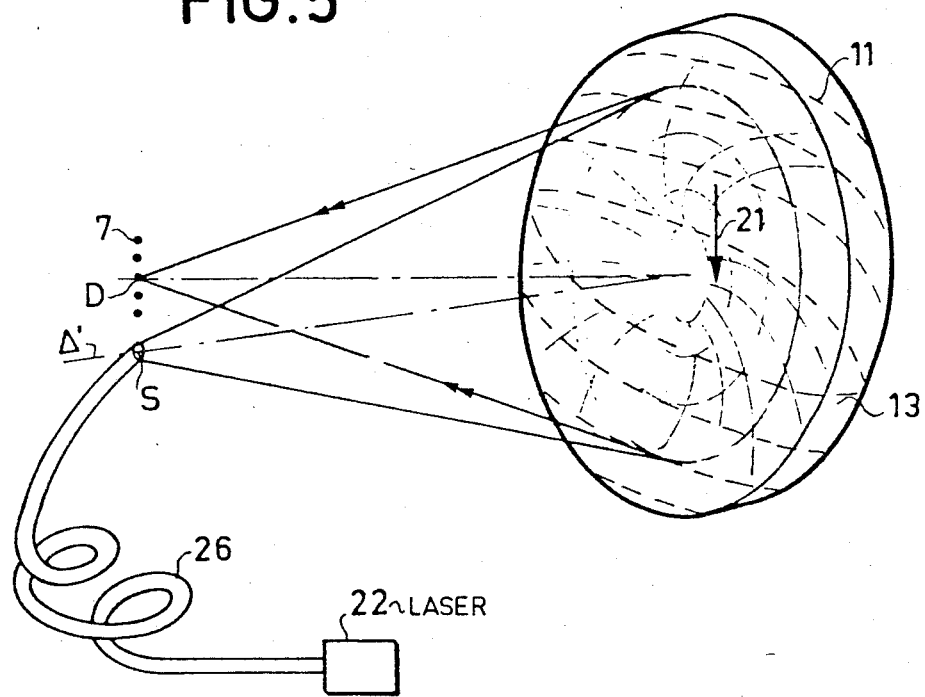
FIG. 5 a special configuration of the analyzer according to the invention.

FIG. 5 illustrates a special configuration of the invention. Source S is obtained by the end of an optical fibre 26, whose other end is connected to a laser LA.

In the medium forming the spherical mirror 13, the layer line 11 move at a velocity 21 or $V_S$ in a direction perpendicular to that of the fingers of the aforementioned split-finger transducer.

After diffraction, the incident wave reaches the line of detectors 7. The generation of sound waves on the outer surface of the mirror 13 or on the face opposite to the source, offers the advantage of bringing about a double passage of the spherical incident wave in the medium and consequently a double passage in the index network, whilst taking account of the modification of the relief on said outer surface. Thus, there is a multiplicative effect on the index.

For example, the detectors can be a line of 256 or 1024 points and can consist of individual photodiodes or charge coupled devices permitting a scanning of all the detectors.

Thus, the analyzer according to the invention has the advantage of an excellent simplicity of the optical configuration, which can be produced with a very high degree of accuracy (variations at the wave surface less than λ/4) and excellent compatibility, with e.g. a high resolution of 1000 points.

What is claimed is:

1. A spectrum analyzer comprising a light source supplying a collimated light beam, a piezoelectric, elasto-optical interaction medium, a transducer which generates an acousto-optical wave in this medium, said acousto-optical wave creating an index grating with a specific spacing, propagating at the velocity of sound $V_S$ in the said medium, said transducer being subject to the action of a control signal, and a line of detectors for detecting the spectrum of the control signal, the light beam being diffracted by this index grating in order to reach the line of detectors, wherein the source is positioned in the vicinity of the centre of curvature of the interaction medium, which is in the form of a spherical cap or cup, the transducer being in the form of a split-finger transducer deposited on the opposite face of the spherical cap or cup with respect to the source, the acousto-optical wave generator being a surface wave.

2. An analyzer according to claim 1, wherein the split-finger transducer comprises two electrodes, whereof the fingers of each of them have their median lines separated by a length equal to the spacing of the index grating at the mean frequency of the control signal.

3. An analyzer according to claim 1, wherein the piezoelectric elasto-optical interaction medium is of lithium niobate.

4. An analyzer according to claim 1, wherein the source is formed by the end of an optical fibre, whose other end is connected to a laser.

* * * * *